United States Patent
Horie

(10) Patent No.: US 6,320,530 B1
(45) Date of Patent: Nov. 20, 2001

(54) RECYCLING A/D CONVERTER

(75) Inventor: Masakiyo Horie, Gamagoori (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/583,869

(22) Filed: May 31, 2000

(30) Foreign Application Priority Data

Jun. 1, 1999 (JP) .................................. 11-153921
Feb. 29, 2000 (JP) .................................. 12-539313

(51) Int. Cl.$^7$ .................................. H03M 1/66
(52) U.S. Cl. .................................. 341/163; 341/172
(58) Field of Search .................................. 341/155, 159, 341/163, 122

(56) References Cited

U.S. PATENT DOCUMENTS

| 5,416,485 | 5/1995 | Lee | 341/172 |
| 5,635,937 | 6/1997 | Lim et al. | 341/161 |
| 5,696,509 | * 12/1997 | Maejima | 341/150 |
| 6,016,115 | * 1/2000 | Heubi | 341/161 |

FOREIGN PATENT DOCUMENTS

| 5-152959 | 6/1993 | (JP) . |
| 5-244003 | 9/1993 | (JP) . |
| 5-77218 | 10/1993 | (JP) . |
| 6-83069 | 10/1994 | (JP) . |
| 6-83070 | 10/1994 | (JP) . |
| 6-83072 | 10/1994 | (JP) . |

OTHER PUBLICATIONS

"A 10–b 15–MHz CMOS Recycling Two–Step A/D Converter"by B.S.Song, S.H.Lee, M.F. Tompsett; IEEE Journal of Solid–State Circuits. vol. 25, no. 6; Dec. 1990; pp., 1328–1338.

"Digital–Domain Calibration of Multistep Analog–to–Digital Converters"by S H. Lee & B.S. Song; IEEE Journal of Solid–State Circuits, vol. 27, No. 12, Dec. 1992; pp.,1679–1688.

* cited by examiner

Primary Examiner—Tuan T. Lam
(74) Attorney, Agent, or Firm—Law Offices of David G. Rose

(57) ABSTRACT

After a second (i.e., $2^{nd}$-step) A/D conversion code n2 is produced from an A/D conversion circuit 1, a switch S10 is turned off and a switch S11 is turned on so that an operational amplifier 3 and a capacitor CF cooperate as a hold circuit. Arrayed capacitors C0 to C7 are charged based on an output voltage of the operational amplifier 3. Next, switches S11 and S12 are turned off and switches S13 to S15 are turned on to initialize the electric charge of the capacitor CF to 0 and to charge a capacitor CIN to a predetermined level (=V1+VOFF), wherein VOFF is an offset voltage of the operational amplifier 3. Subsequently, switches S13 to S15 are turned off and the switch S12 is turned on. Then, the switch S10 is turned on and switches S0 to S7 are shifted to a reference voltage terminal 2 or to a ground terminal GND, thereby implementing charge redistribution.

14 Claims, 11 Drawing Sheets

RECYCLING A/D CONVERTER

BACKGROUND OF THE INVENTION

The present invention relates to a recycling A/D converter capable of implementing the A/D converting processing including not less than three steps.

As disclosed in the Japanese Patent publication No. 6-83069 or in the IEEE Journal of Solid-state Circuits, Vol. 25, No. 6, December 1990, pp1328–PP1338, one of this kind of recycling A/D converters is a so-called two step recycling A/D converter which includes a capacitor array circuit (i.e., an array of capacitors), an operational amplifier, a capacitor connected between the input and output terminals of the operational amplifier, and an A/D conversion circuit of a parallel type.

FIG. 11 shows a circuit arrangement of a 2-step recycling A/D converter. An A/D conversion circuit 1 of a parallel type has an input terminal selectively connectable to a signal input terminal 2 or an output terminal of an operational amplifier 3 via a switch S8. A capacitor array circuit 4 comprises a plurality of arrayed capacitors C0 to C7 which have common electrodes respectively connected to a common line 5. The arrayed capacitors C0 to C7 have non-common electrodes respectively connectable via switches S0 to S7 to one of the input terminal of the A/D conversion circuit 1, a reference voltage terminal 6, and a ground terminal GND. The operational amplifier 3 has an inverting input terminal connected to the common line 5. A capacitor CF and a switch S9 are connected in parallel with each other between the input and output terminals of the operational amplifier 3.

In this circuit arrangement, the A/D conversion circuit 1 implements a first step A/D conversion under a condition where the switch S8 is connected to the input terminal of the A/D conversion circuit 1, while the switches S0 to S7 are respectively connected to the input terminal of the A/D conversion circuit 1 and the switch S9 is turned on.

After the first step A/D conversion is completed, the switch S9 is turned off. Respective switches S0 to S7 are shifted to either the reference voltage terminal 6 or the ground terminal GND in accordance with an A/D conversion code resulting from the first step A/D conversion. As a result, the operational amplifier 3 produces an output voltage equivalent to a residue voltage of the first step A/D conversion result. Then, the switch S8 is shifted to the output terminal of the operational amplifier 3. The A/D conversion circuit 1 implements a second step A/D conversion. An adder 7 adds the A/D conversion code of the first step and the A/D conversion code of the second step, thereby producing an A/D conversion output having a resolution higher than that of the A/D conversion circuit 1.

According to the above-described conventional 2-step recycling A/D converter, the circuit scale of the A/D conversion circuit 1 and the capacitor array circuit 4 expands in proportion to the enhancement of resolution (i.e., bit number). This leads to an undesirable increase of the chip size.

SUMMARY OF THE INVENTION

To reduce the required resolution level in each step, it is effective to replace the above-described conventional 2-step A/D converter by a recycling A/D converter capable of implementing the A/D conversion processing including not less than three steps. In addition to the chip size, consumption of electric power will be greatly reduced.

If the above-described conventional 2-step A/D converter is directly used to implement the third and succeeding conversion operations, electric charge of the capacitor CF will transfer to the arrayed capacitors C0 to C7 upon connecting the output terminal of the operational amplifier 3 to the non-common terminals of the arrayed capacitors C0 to C7 via the switches S0 to S7. This will cause an undesirable change in the output voltage level of the operational amplifier 3.

To eliminate this problem, it may be effective to provide a sample-and-hold circuit connected to the output terminal of the operational amplifier 3. In this case, the sample-and-hold circuit holds the output voltage of the operational amplifier 3. Charge setting for the arrayed capacitors C0 to C7 is performed based on the voltage value held by the sample-and-hold circuit.

However, providing the sample-and-hold circuit in the recycling loop is not preferable in that an error is newly produced from the sample-and-hold circuit. For example, an error of the sample-and-hold circuit is derived from an offset voltage of an operational amplifier which serves as an essential circuit component of the sample-to-hold circuit. The error thus produced is cumulatively accumulated through the repetition of steps of the conversion processing. As a result, the resultant conversion error will become large. On the other hand, it is generally difficult for manufacturers to predict such a conversion error at an earlier stage (for example, in the design stage of the circuit). Furthermore, providing the sample-and-hold circuit necessarily expands the circuit size due to additional circuit components (e.g., the operational amplifier and the hold capacitor) constituting the sample-and-hold circuit. Accordingly, the chip size increases correspondingly and the consumption of electric power increases too.

In view of the above, an object of the present invention is to provide a novel recycling A/D converter which is compact in chip size and is capable of accurately implementing the A/D conversion processing including not less than three steps.

In order to accomplish this and other related objects, a recycling A/D converter of the present invention comprises an A/D conversion circuit, and a capacitor array circuit comprising a plurality of arrayed capacitors. Each arrayed capacitor has a common electrode connected to a common line and a non-common electrode selectively connectable to either a first reference voltage line or a second reference voltage line in response to a conversion result of the A/D conversion circuit. An operational amplifier has an input terminal connected to the common line. An integrating capacitor is connected between the input terminal and an output terminal of the operational amplifier. An integration initializing circuit is provided for initializing the integrating capacitor. A circuit arrangement is provided for inputting an output voltage of the operational amplifier to the A/D conversion circuit and to the non-common electrodes of the arrayed capacitors. A first switching circuit is provided between the common line and the input terminal of the operational amplifier. And, a second switching circuit is provided between the common line and the first reference voltage line.

According to the recycling A/D converter of the present invention, in the A/D conversion of a third or succeeding step, charge setting of each arrayed capacitor is implemented based on the output voltage of the operational amplifier by closing the second switching circuit under a condition where the first switching circuit is opened, and then the integrating capacitor is initialized by the integration initializing circuit.

With this circuit arrangement, it becomes possible to make the operational amplifier connected to the integrating capacitor act as a hold circuit by opening the first switching circuit provided between the common line and the input terminal of the operational amplifier. Furthermore, as the second switching circuit is provided between the common line and the first reference voltage line, it becomes possible to implement the charge setting of the arrayed capacitors based on the output voltage of the operational amplifier by closing the second switching circuit even when the first switching circuit is opened.

In the third and succeeding steps of the conversion processing, it is necessary to perform the charge setting of the arrayed capacitors and the initialization of the integrating capacitor based on the principle of the charge redistribution as one preprocessing for obtaining the residue voltage with respect to the conversion result of the A/D conversion circuit.

According to the arrangement of the present invention, the operational amplifier acts as a hold circuit when the first switching circuit is opened. Under this condition, the second switch circuit is closed to implement the charge setting for each arrayed capacitor. Then, the integration initializing circuit initializes the integrating capacitor. As a result, it becomes possible to realize the recycling A/D conversion processing including at least first to third steps.

Furthermore, using the operational amplifier connected to the integrating capacitor as a hold circuit brings an excellent effect in that the A/D conversion result is accurately obtained without involving new error. Moreover, as the component size of the added switch circuits is relatively small, the chip size is compact and the electric power consumption can be suppressed to a small value.

According to preferable embodiments of the present invention, the integration initializing circuit is constituted by an integration initializing switch circuit connected in parallel to the integrating capacitor. The integrating capacitor is initialized by closing the integration initializing switch circuit under a condition where the first and second switching circuits are opened. Thus, the initialization of the integrating capacitor is implemented under the condition where the electric charge level of each arrayed capacitor is unchanged.

According to the preferable embodiments of the present invention, an offset compensating capacitor is interposed between the input terminal of the operational amplifier and a common connecting point of one terminal of the first switching circuit and one terminal of the integrating capacitor, and an offset compensating voltage charging circuit is provided for charging the offset compensating capacitor to an offset compensating voltage level. With this circuit arrangement, the input terminal of the operational amplifier is connected to the common line via the offset compensating capacitor whose charge level is maintained at the offset compensating voltage level (and the first switching circuit). Thus, the offset voltage of the operational amplifier can be canceled by the offset compensating voltage during the charge redistribution. It becomes possible to prevent the voltage level of the common line from changing due to the offset voltage of the operational amplifier. The conversion error is reduced.

According to the preferable embodiments of the present invention, the integration initializing circuit comprises a first integration initializing switch circuit connected between the other terminal of the integrating capacitor and the output terminal of the operational amplifier, a second integration initializing switch circuit connected between the other terminal of the integrating capacitor and the first reference voltage line, and a third integration initializing switch circuit connected between the one terminal of the integrating capacitor and the first reference voltage line. And, the offset compensating voltage charging circuit comprises a compensating charge switch circuit connected between the input and output terminals of the operational amplifier. With this circuit arrangement, the both ends of the integrating capacitor are connectable to the first reference voltage line via the second and third integration initializing switch circuits, respectively. Thus, the initialization of the integrating capacitor can be implemented by closing the second and third integration initializing switch circuits. Furthermore, the offset compensating capacitor can be charged to the offset compensating voltage level by closing the compensating charge switch circuit and (the third integration initializing switch circuit).

According to the preferable embodiments of the present invention, initialization of the integrating capacitor and charging of the offset compensating capacitor are implemented by closing the compensating charge switch circuit and the second and third integration initializing switch circuits while opening the first integration initializing switch circuit under a condition where the first and second switching circuits are opened. With this circuit arrangement, the electric charge stored in the integrating capacitor can be initialized by closing the compensating charge switch circuit and the second and third integration initializing switch circuits. The common line side electrode of the offset compensating capacitor has an electrical potential level equal to the reference voltage. The op-amp. side electrode of the offset compensating capacitor has an electric potential equal to a sum of a bias voltage and an offset voltage of the operational amplifier. The sum of the bias voltage and the offset voltage of the operational amplifier is referred to as an offset compensating voltage. In this case, as the first and second switching circuits are opened, the electric charge stored in each arrayed capacitor is unchanged.

According to the preferable embodiments of the present invention, the integration initializing circuit comprises a first integration initializing switch circuit connected between the other terminal of the integrating capacitor and the output terminal of the operational amplifier, and a second integration initializing switch circuit connected between the other terminal of the integrating capacitor and the first reference voltage line. The offset compensating voltage charging circuit comprises a compensating charge switch circuit connected between the input and output terminals of the operational amplifier. And, the non-common electrodes of the arrayed capacitors are arranged to be openable. With this arrangement, the other terminal of the integrating capacitor is connectable to the first reference voltage line via the second integration initializing switch circuit. One terminal of the integrating capacitor is connectable to the first reference voltage line via the first and second switching circuits. Thus, the integrating capacitor can be initialized by simultaneously closing the second integration initializing switch circuit and the first and second switching circuits. Furthermore, the offset compensating capacitor can be charged to the offset compensating voltage level by closing the compensating charge switch circuit and (the first and second switching circuits).

According to the preferable embodiments of the present invention, initialization of the integrating capacitor and charging of the offset compensating capacitor are implemented by closing the first and second switching circuits, the compensating charge switch circuit and the second integration initializing switch circuit while opening the first integration initializing switch circuit under a condition where the non-common electrodes of the arrayed capacitors are opened. With this arrangement, the initialization of the integrating capacitor and the charging of the offset compensating capacitor are implemented under the condition where the non-common side electrodes of the arrayed capacitors are opened. Accordingly, the electric charge stored in each arrayed capacitor is unchanged even if the first and second switching circuits are closed.

According to the preferable embodiments of the present invention, the operational amplifier is biased by a predetermined voltage which is within a power voltage supplied to the operational amplifier. With this arrangement, it becomes possible to realize a high-gain and high-speed operation of the operational amplifier. The settling time of the operational amplifier can be shortened. As a result, the time required for the A/D conversion can be reduced. As the gain is high, the output voltage error of the operational amplifier can be decreased. An accuracy of the A/D conversion is improved.

According to the preferable embodiments of the present invention, the A/D conversion circuit is arranged to be differentially operable. The capacitor array circuit, the integrating capacitor, and the integration initializing circuit cooperatively constitute a non-inverting input side conversion result processing circuit which is connected to an inverting input terminal of the operational amplifier. An inverting input side conversion result processing circuit, identical in arrangement with the non-inverting input side conversion result processing circuit, is connected to a non-inverting input terminal of the operational amplifier. The non-inverting input side conversion result processing circuit and the inverting input side conversion result processing circuit are differentially operable.

According to the preferable embodiments of the present invention, the A/D conversion circuit is arranged to be differentially operable. The capacitor array circuit, the integrating capacitor, the integration initializing circuit, the offset compensating capacitor, and the offset compensating voltage charging circuit cooperatively constitute a non-inverting input side conversion result processing circuit which is connected to an inverting input terminal of the operational amplifier. An inverting input side conversion result processing circuit, identical in arrangement with the non-inverting input side conversion result processing circuit, is connected to a non-inverting input terminal of the operational amplifier. The non-inverting input side conversion result processing circuit and the inverting input side conversion result processing circuit are differentially operable.

With these arrangement, the inverting input terminal and the non-inverting input terminal of the operational amplifier are respectively connected to the non-inverting input side conversion result processing circuit and the inverting input side conversion result processing circuit which are differentially operable. Thus, it becomes possible to effectively remove common mode noises. As the circuit arrangement is symmetrical, it becomes possible to cancel feedthrough errors occurring during the switching operation of the switches. As a result, the conversion accuracy is improved.

According to the preferable embodiments of the present invention, the arrayed capacitors are identical with each other in their capacitance values. With this arrangement, with respect to the connection of the arrayed capacitors to the first reference voltage line or to the second reference voltage line, the connection of only one arrayed capacitor is changed in response to a change amount "1" in the A/D conversion code of the A/D conversion circuit. Thus, the derivative non-linearity is improved.

According to the preferable embodiments of the present invention, capacitance values of the arrayed capacitors are weighted in terms of $2^n$, where n is an integer. With this arrangement, it becomes possible to reduce the number of switches required for shifting the non-common side electrodes of the arrayed capacitors to the first reference voltage line or to the second reference voltage line. The layout of the switch circuit becomes compact.

According to the preferable embodiments of the present invention, the A/D conversion circuit has a resolution of "m" bits. The capacitance of the integrating capacitor is set to $\frac{1}{2}^{(m-1)}$ equivalent to a sum of capacitances of the arrayed capacitors. And, a total of n steps of A/D conversion values produced from the A/D conversion circuit are successively added by overlapping one bit and cutting a least significant bit, thereby generating an A/D conversion output having a resolution of $n \times (m-1)$ bits. With this arrangement, the theoretical voltage width (i.e., an errorless value) of the residue voltage produced from the operational amplifier is limited to ½ of a difference voltage width between the first reference voltage line and the second reference voltage line. Thus, the output voltage range of the operational amplifier is limited to ½ of the full range. Accordingly, even if a conversion error equal to or smaller than ½LSB exists in the A/D conversion circuit 1, the output voltage of the operational amplifier does not exceed a voltage range of the above difference voltage. Hence, it is possible to obtain a finalized A/D conversion output without worsening the derivative non-linearity in the connection code portion of the conversion result in each step.

According to the preferable embodiments of the present invention, the A/D conversion circuit is a parallel type. With this arrangement, it becomes possible to provide a so-called serial-parallel recycling A/D converter which realizes a high-speed conversion processing.

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF THE PREFERRED EMBODIMENTS

Preferred embodiments of the present invention will be explained hereinafter with reference to attached drawings.

First Embodiment

A first embodiment of the present invention provides a novel recycling A/D converter of a serial-parallel type which will be explained hereinafter with reference to FIGS. 1 to 4.

Figure 1:
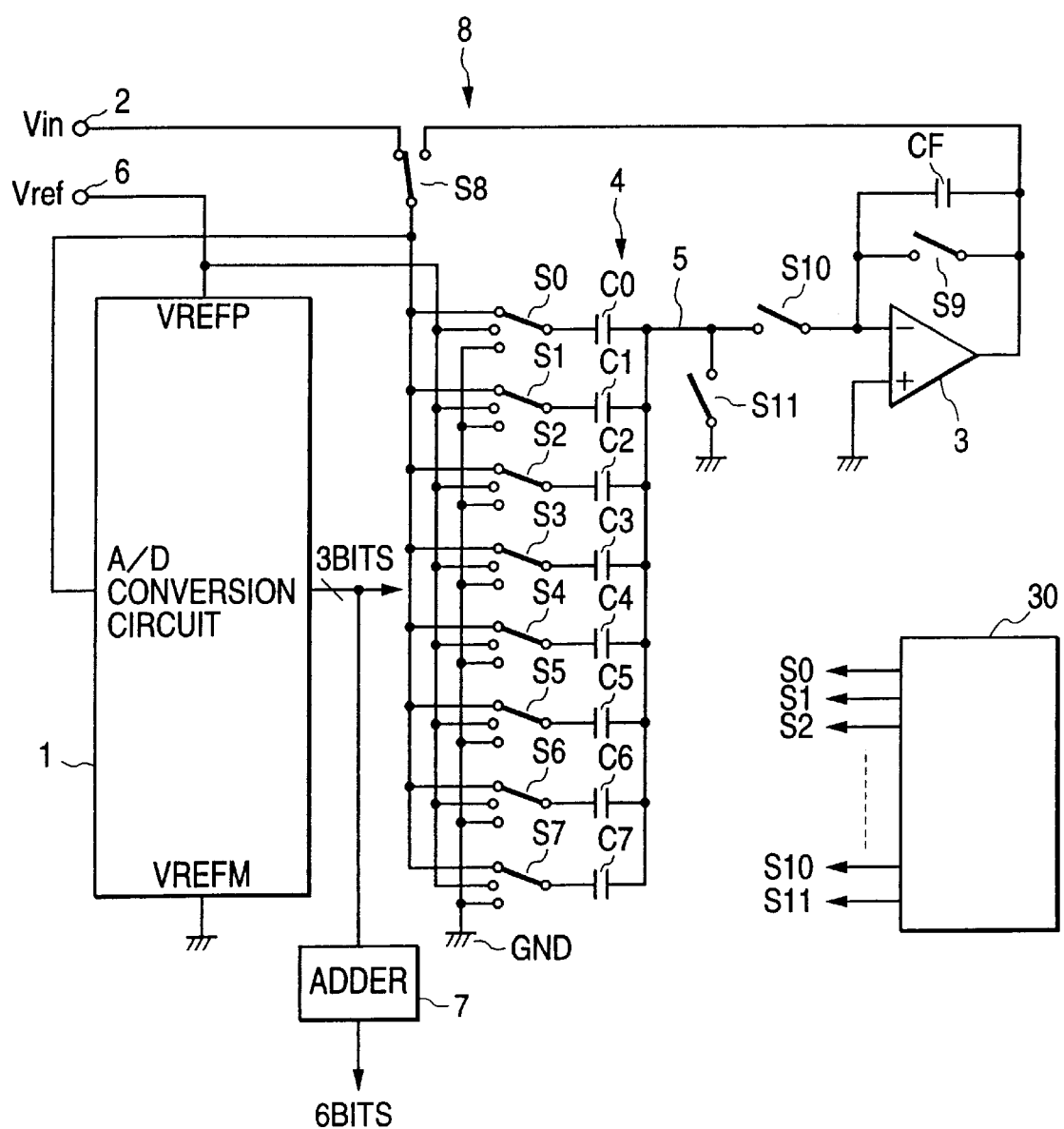
FIG. 1 is a circuit diagram showing the arrangement of a recycling A/D converter in accordance with a first embodiment of the present invention.
Figure 11:
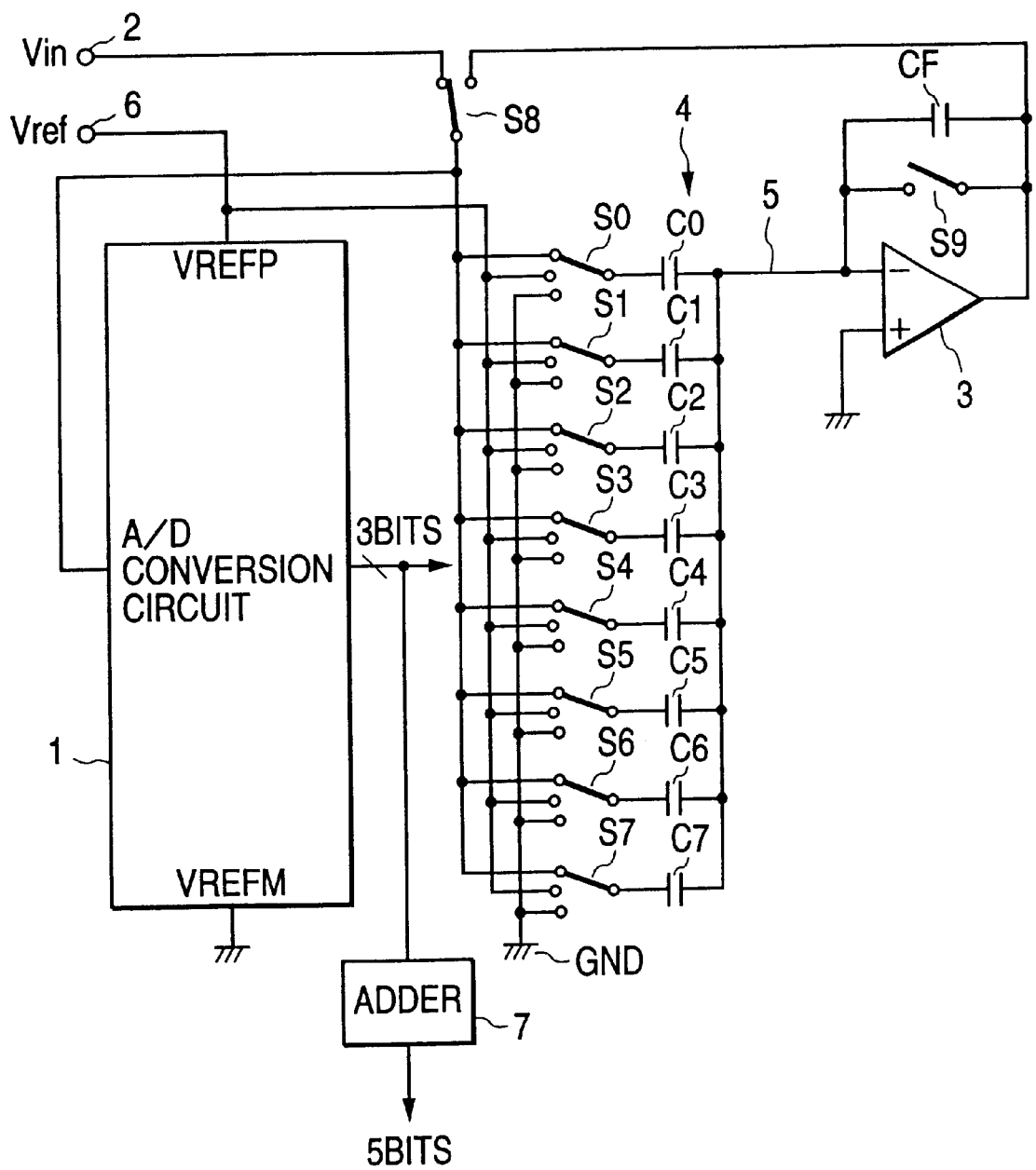
FIG. 11 is a circuit diagram showing the arrangement of a conventional 2-step recycling A/D converter.

FIG. 1 shows a schematic circuit arrangement of a recycling A/D converter 8 which is fabricated by using the CMOS processing. The components identical with those disclosed in FIG. 11 are denoted by the same reference numbers.

More specifically, the A/D conversion circuit 1 of a parallel type has a 3-bit level resolution. The input terminal of the A/D conversion circuit 1 is selectively connectable to the signal input terminal 2 or the output terminal of the operational amplifier 3 via the switch S8. The A/D conversion circuit 1 has a first reference voltage input terminal VREFP which is connected to the reference voltage terminal 6 having an electrical potential of reference voltage Vref, and a second reference voltage input terminal VREFM which is connected to the ground terminal GND. For example, the reference voltage Vref is set to 5V. The operational amplifier 3 operates under electric supply from a 5V power source.

Figure 2:
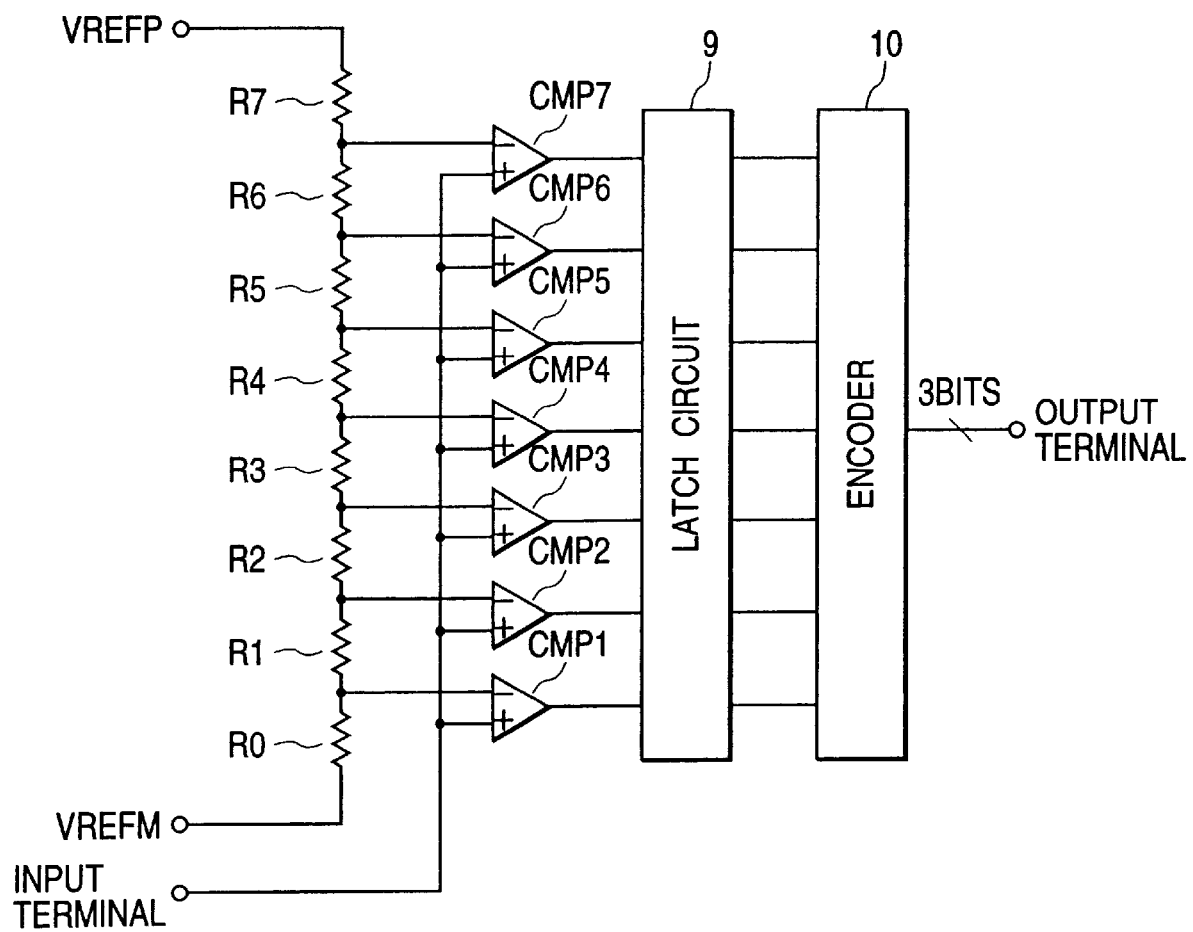
FIG. 2 is a circuit diagram showing a 3-bit A/D conversion circuit in accordance with the first embodiment of the present invention.

FIG. 2 shows a detailed circuit arrangement of the A/D conversion circuit 1. A plurality of resistors R0 to R7 are serially connected between the reference voltage input terminals VREFP and VREFM. A common connecting point of resistors R0 and R1 is connected to an inverting input terminal of a comparator CMP1. Similarly, respective common connecting points of resistors R1 and R2, resistors R2 and R3, - - - , and resistors R6 and R7 are connected to inverting input terminals of corresponding comparators CMP2, CMP3, - - - , and CMP7. Non-inverting input terminals of the comparators CMP1, CMP2, - - - , and CMP7 are connected to the input terminal of the A/D conversion circuit 1. The resistance values of the resistors R0 and R7 are set to R0=1.5R[Ω] and R7=0.5R[Ω] while a resistance value of the remaining resistors R1 to R6 is set to R[Ω].

Each of the comparators CMP1, CMP2, - - - , and CMP7 produces a high-level or low-level output signal which is sent to a latch circuit 9. The latch circuit 9 holds the output signals of the comparators CMP1, CMP2, - - - , and CMP7 in response to a high-level latch signal. Then, the latch circuit 9 sends the thus held output signals to an encoder 10. The encoder 10 produces an A/D conversion code ranging from "000" to "111" based on the signal received from the latch circuit 9. The adder 7 adds the produced A/D conversion code as described later in detail.

In FIG. 1, the capacitor array circuit 4 comprises a plurality of arrayed capacitors C0 to C7 which are identical with each other in their capacitance values (=C). The bottom electrodes, each serving as a common electrode, of the arrayed capacitors C0 to C7 are connected to the common line 5. The top electrodes, each serving as a non-common electrode, of the arrayed capacitors C0 to C7 are selectively connectable to the input terminal of the A/D conversion circuit 1 (i.e., the signal input terminal 2 or the output terminal of the operational amplifier 3), to the reference voltage terminal 6, or to the ground terminal GND via the switches S0 to S7, respectively. The power line, connected to the ground terminal GND whose potential level is 0 V, serves as the first reference voltage line of the present invention. The power line, connected to the reference voltage terminal 6 whose potential level is Vref, serves as the second reference voltage line of the present invention.

The common line 5 is connected to the inverting input terminal of the operational amplifier 3 via the switch S10 which serves as the first switching circuit of the present invention. Meanwhile, the common line 5 is connected to the ground terminal GND via the switch S11 which serves as the second switching circuit of the present invention. The capacitor CF, acting as the integrating capacitor, is connected between the inverting input terminal and an output terminal of the operational amplifier 3. The capacitor CF has a capacitance value of "2C." The switch S9, acting as the integration initializing circuit or the integration initializing switch circuit, is connected in parallel to the capacitor CF between the inverting input terminal and the output terminal of the operational amplifier 3. The operational amplifier 3 has the non-inverting input terminal connected to the ground terminal GND.

The switches S0 to S11 are, for example, constituted by analog switches which are on-off controllable by a control circuit 30.

The A/D conversion circuit 1 repeats the 3-bit (i.e., m=3) A/D conversion three times (i.e., three steps, n=3) to produce an A/D conversion output of 6 bits.

Figure 3:
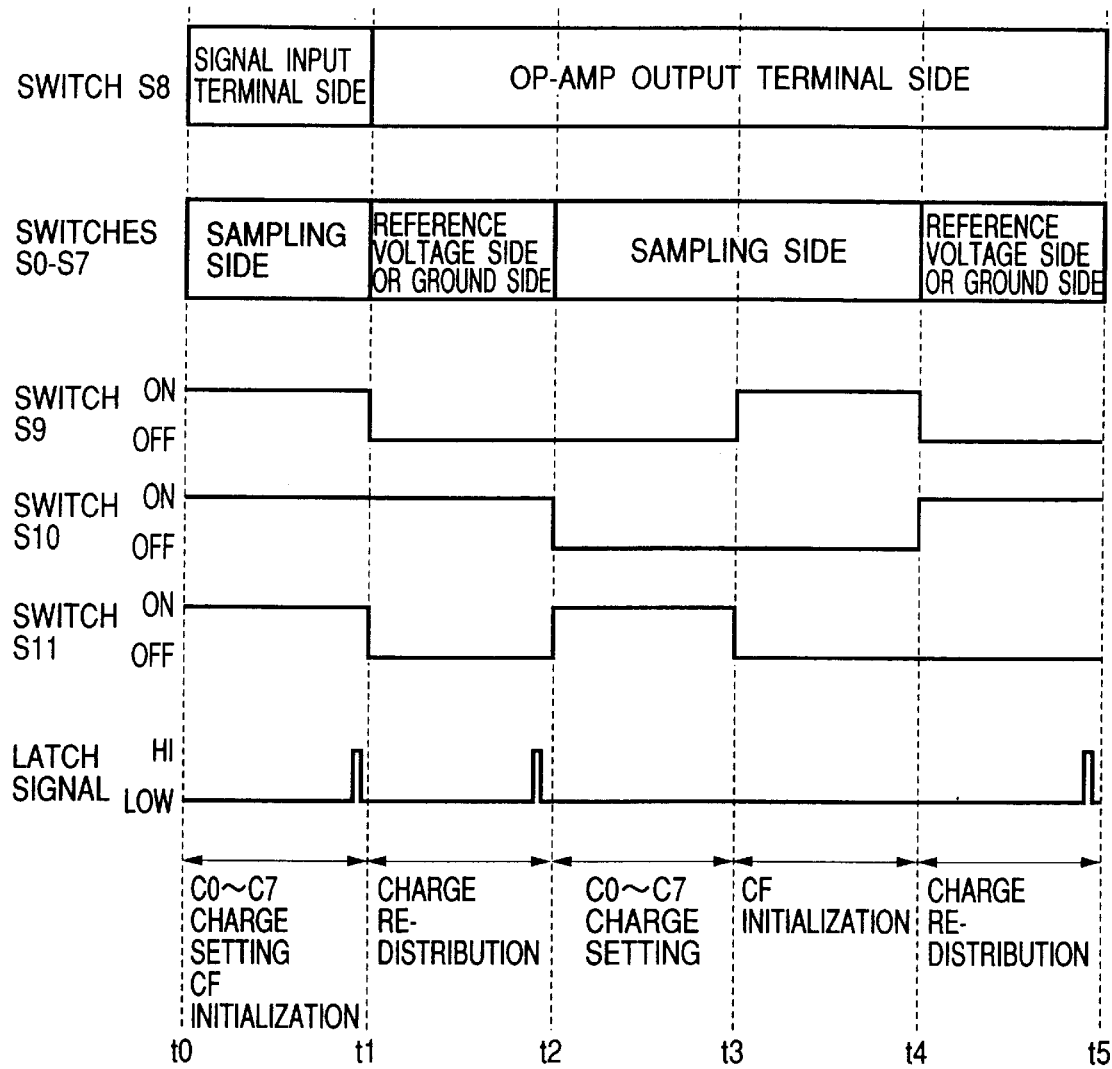
FIG. 3 is a time diagram showing operation timings of various switches in accordance with the first embodiment of the present invention.

FIG. 3 shows the operation of the recycling A/D converter 8 during this three consecutive A/D conversion operations. At an initial condition before starting the A/D conversion processing, the switches S9 and S11 are turned off and the switch S10 is turned on. The adder 7 is cleared to 0.

(1) Time duration from t0 to t1 (i.e., First step)

At the time t0, in response to an A/D conversion start signal entered from the outside, the switch S8 is connected to the signal input terminal 2. The A/D conversion circuit 1 starts the first (i.e., $1^{st}$ step) A/D conversion in response to a conversion input voltage (i.e., the input signal voltage Vin). In the A/D conversion circuit 1, after the output signals of the comparators CMP1 to CMP7 are settled, the latch circuit 9 holds the conversion result of the first (i.e., $1^{st}$ step) A/D conversion in response to a latch signal. Then, the adder 7 adds the A/D conversion code n1 of 3 bits produced from the encoder 10.

Meanwhile, at the time t0, the control circuit 30 turns on the switch S11 to connect the bottom electrodes of the arrayed capacitors C0 to C7 to the ground terminal GND. Furthermore, the control circuit 30 connects the switches S0 to S7 to the input terminal side of the A/D conversion circuit 1. The input terminal side of the A/D conversion circuit 1 is referred to as a "sampling side." With this switching, the top electrodes of the arrayed capacitors C0 to C7 are connected to the signal input terminal 2 via the switch S8 to implement the charge setting. Through this charge setting, each of the arrayed capacitors C0 to C7 is charged to the voltage level of input signal voltage Vin. The control circuit 30 turns on the switch S9 to short-circuit the both ends of the capacitor CF, to initialize the electric charge of capacitor CF.

(2) Time duration from t1 to t2 (i.e., Second step)

After the first A/D conversion code n1 is held, the control circuit 30 turns off the switches S9 and S11 at the time t1. After the switches S9 and S11 are completely opened, respective switches S0 to S7 are shifted from the sampling side to the reference voltage terminal 6 (herein referred to as "reference voltage side") or to the ground terminal GND (herein referred to as "ground side").

The switching of respective switches S0 to S7 is implemented based on the first A/D conversion code n1. For example, when the A/D conversion code n1 is "000", all of the switches S0 to S7 are connected to the ground side. When the A/D conversion code n1 is "001", all of the switches S0 to S7 except one are connected to the ground side. The only one switch (e.g., switch S0) is connected to the reference voltage side. When the A/D conversion code n1 is "111", all of the switches S0 to S7 are connected to the reference voltage side.

Before and after implementing the switching of respective switches S0 to S7, the electric charge of the common line 5 remains unchanged. Thus, after the switching of respective switches S0 to S7 is finished, the operational amplifier 3 performs a feedback control via the capacitor CF to reduce the voltage level of the common line 5 to 0V. In other words, the electric potential of the inverting input terminal of the operational amplifier 3 is reduced to 0V. As a result, the charge redistribution is implemented between the arrayed capacitors C0 to C7 and the capacitor CF. In this case, when VRES(1) represents the output voltage of the operational amplifier 3, the conservation of charge is expressed by the following equation (1).

$$8C \times (0-Vin) = n1 \times C \times (0-Vref) + 2C(0-VRES(1)) \quad (1)$$

From the above equation (1), the following equation (2) is derived.

$$VRES(1) = 4 \times (Vin - n1 \times Vref/8) \quad (2)$$

Namely, the operational amplifier 3 produces the residue voltage VRES(1) which is obtained by subtracting a D/A conversion voltage corresponding to the first A/D conversion code n1 from the input signal voltage Vin and then multiplying the obtained voltage by $4(=2^2)$. The reason for using 4 (i.e., not using 8) is that the capacitance of the capacitor CF is set to $\frac{1}{2}^{(m-1)} = \frac{1}{4}$ of a sum (8C) of the arrayed capacitors C0 to C7.

Figure 4:
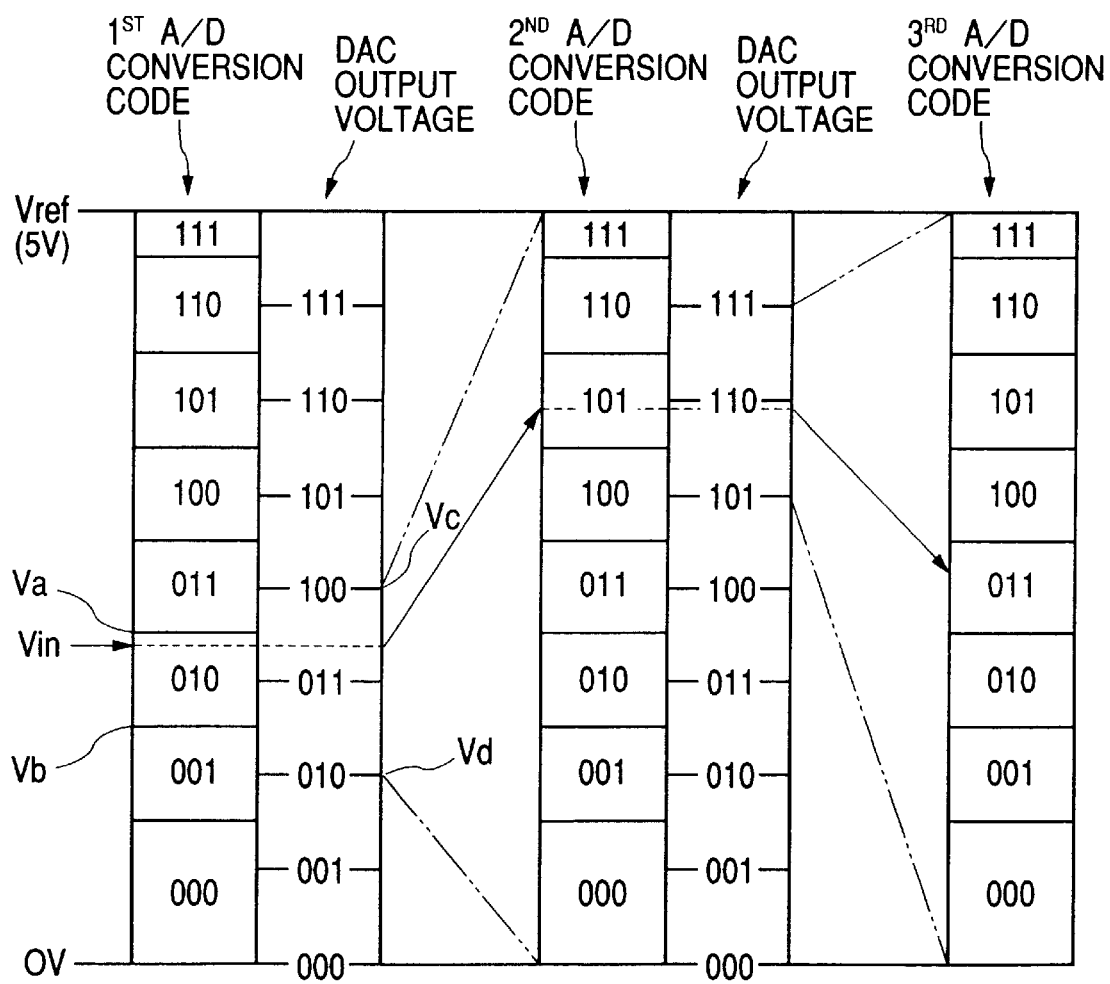
FIG. 4 is a diagram illustrating A/D conversion codes produced in accordance with the first embodiment of the present invention.

After the charge redistribution is completed, when the output voltage of the operational amplifier 3 is stabilized (e.g., at a predetermined time after time t1), the A/D conversion circuit 1 starts a second 3-bit A/D conversion to obtain a second A/D conversion code n2. After the second 3-bit A/D conversion is completed, the obtained second A/D conversion code n2 is held in the latch circuit 9. As shown in FIG. 4, the adder 7 adds the A/D conversion code n2 to the A/D conversion code n1 by overlapping one bit. The conventional recycling 2-step A/D converter shown in FIG. 11 completes the conversion processing at this moment.

(3) Time duration from t2 to t3 (i.e., Third step)

The third A/D conversion needs to be implemented based on a residue voltage VRES(2) of the second A/D conversion. The second A/D conversion is obtained by subtracting a D/A conversion voltage corresponding to the second A/D conversion code n2 from the output voltage VRES(1) of the operational amplifier 3 and then multiplying the obtained voltage by $4(=2^2)$. To obtain the residue voltage VRES(2) of the second A/D conversion, the present invention provides a characteristic circuit arrangement which is capable of charging all of the arrayed capacitors C0 to C7 to the voltage level of VRES(1), i.e., implementing the charge setting, as well as initializing the capacitor CF.

Namely, after the second A/D conversion code n2 is held, the control circuit 30 turns off the switch S10 at the timing t2. With this switching operation, the capacitor CF and the operational amplifier 3 cooperatively work as a hold circuit which holds the output voltage VRES(1) of the operational amplifier 3. Meanwhile, the control circuit 30 turns on the switch S11 and shifts respective switches S0 to S7 to the sampling side. Under this condition, the top electrodes of the arrayed capacitors C0 to C7 are connected to the output terminal of the operational amplifier 3 via the switch S8. The array capacitors C0 to C7 are charged to the voltage level of the output voltage VRES(1) of the operational amplifier 3.

(4) Time duration from t3 to t4 (i.e., Third step)

After the charge setting of the arrayed capacitors C0 to C7 is completed, the control circuit 30 turns off the switch S11 at the time t3 and then turns on the switch S9. At this moment, as the common line 5 is in an opened condition, the electric charge of the capacitor CF is initialized to 0 without causing any change in the electric charges of the arrayed capacitors C0 to C7.

(5) Time duration from t4 to t5 (i.e., Third step)

After the initialization of the capacitor CF is accomplished, the control circuit 30 turns off the switch S9 at the time t4. After the switch S9 is completely opened, the control circuit 30 turns on the switch S10 and shifts respective switches S0 to S7 from the sampling side to the reference voltage side or to the ground side. The switching of respective switches S0 to S7 is implemented according to the method described in the above (2).

As a result, the charge redistribution is implemented between the arrayed capacitors C0 to C7 and the capacitor CF. In this case, the conservation of charge is expressed by the following equation (3).

$$8C \times (0-VRES(1)) = n2 \times C \times (0-Vref) + 2C(0-VRES(2)) \quad (3)$$

From the above equation (3), the following equation (4) is derived.

$$VRES(2) = 4 \times (VRES(1) - n2 \times Vref/8) \quad (4)$$

Furthermore, from the above equations (2) and (4), the following equation (5) is derived.

$$VRES(2) = 16 \times (Vin - (4 \times n1 + n2) \times Vref/32) \quad (5)$$

After the output voltage of the operational amplifier 3 is stabilized, the A/D conversion circuit 1 starts a third 3-bit A/D conversion to obtain a third A/D conversion code n3. After the third 3-bit A/D conversion is completed, the obtained third A/D conversion code n3 is held in the latch circuit 9. Then, the adder 7 adds the A/D conversion code n3 to the sum of the A/D conversion code n1 and the A/D conversion code n2 by overlapping one bit. Then, a finalized A/D conversion code of the recycling A/D converter 8 is obtained by cutting the least significant bit. The finalized A/D conversion code of the recycling A/D converter 8 is 6 bits (i.e., n×(m−1)=6 bits when m=n=3).

Production of this 6-bit A/D conversion code will be explained in more detail with reference to FIG. 4. As shown in FIG. 4, the recycling A/D converter 8 adds the conversion codes n1, n2 and n3 by overlapping one bit. The D/A conversion voltage corresponding to the A/D conversion code n1 (or n2) is subtracted from the input signal voltage Vin (or the residue voltage VRES(1)). The obtained value is multiplied by 4 (not 8) to obtain the residue voltage VRES(1)(or VRES(2)) which is used as a next conversion input voltage of the A/D conversion circuit 1.

Through the above processing, the residue voltage VRES(1)(or VRES(2)) produced from the operational amplifier 3 is suppressed within a voltage region of 2.5V which is equivalent to ½ of the full-range voltage (i.e., 5V).

Furthermore, the A/D conversion circuit 1 of 3 bits obtains the conversion codes n1, n2 and n3 by implementing the A/D conversion under a non-uniform voltage step assignment in which the conversion code "000" is assigned to a voltage width of 3/2 LSB and the conversion code "111" is assigned to a voltage width of ½ LSB. Namely, the A/D conversion circuit 1 does not perform the A/D conversion under a uniform voltage step assignment in which the reference voltage Vref is uniformly divided into a total of 8 voltage widths each equivalent to ⅛ Vref.

On the other hand, the D/A conversion of the A/D conversion codes n1 and n2 is implemented according to the charge redistribution for obtaining the residue voltages VRES(1) and VRES(2) with respect to the A/D conversion codes n1 and n2. The D/A conversion of the A/D conversion codes n1 and n2 is performed under the uniform voltage step assignment in which the reference voltage Vref is uniformly divided into a total of 8 voltage widths.

As a result, when the conversion code n1 ("010") corresponds to a voltage range from Va to Vb, the A/D conversion circuit 1 performs the next A/D conversion by expanding the voltage range from Vc to Vd, enlarged by ½ LSB in both upper and lower directions (refer to FIG. 4).

For example, the correlation between the conversion input voltage and the A/D conversion code may change (i.e., deviate) due to inconsistency of the resistance values of resistors R0 to R7 and their design values. The resistors R0 to R7 constitute the A/D conversion circuit 1. However, even in such a case, the conversion input voltage to the A/D conversion circuit 1 falls within the allowable range from 0V to 5V as long as the deviation is suppressed within ±½ LSB. The error resulting from this deviation exclusively appears in the least significant bit after the A/D conversion codes n1, n2 and n3 are added. Accordingly, even if a conversion error equal to or smaller than ½LSB exists in the A/D conversion circuit 1, it is possible to obtain an A/D conversion output of 6 bits by cutting the least significant bit. In other words, the 6-bit A/D conversion output can be obtained without deteriorating the conversion accuracy due to the conversion error.

As described above, according to the first embodiment, the switch S10 is provided between the common line 5 and the operational amplifier 3 and the switch S11 is provided between the common line 5 and the ground terminal GND. Thus, opening the switch S10 makes it possible to cause the operational amplifier 3 and the capacitor CF to cooperatively work as a hold circuit. Furthermore, closing the switch S11 makes it possible to implement the charging (i.e., charge setting) for the arrayed capacitors C0 to C7 based on the output voltage of the operational amplifier 3.

Accordingly, the recycling A/D converter 8 realizes the A/D conversion processing including not less than three steps without requiring an additional sample-and-hold circuit for holding the output voltage of the operational amplifier 3. As this circuit arrangement itself, i.e., a combination of the operational amplifier 3 and the capacitor CF, acts as a hold circuit, a highly accurate A/D conversion result is obtained without causing new errors. Furthermore, the switches S10 and S11 can be constituted by analog switches which are compact in layout and can reduce power consumption compared with the sample-and-hold circuit which necessarily includes an operational amplifier.

Moreover, the arrayed capacitors C0 to C7 have the same capacitance "C." The control circuit 30 changes (=adds) the number of arrayed capacitors whose top electrodes are connected to the reference voltage side during the charge redistribution in proportion to the increase of the number of A/D conversion codes of the A/D conversion circuit 1. According to such a switching method of the arrayed capacitors C0 to C7, the connection of only one arrayed capacitor is changed between the reference voltage side and the ground side in response to a change amount "1" in the A/D conversion code of the A/D conversion circuit 1. Thus, the derivative non-linearity is improved.

Furthermore, the voltage range corresponds to the conversion code produced from the A/D conversion circuit 1 is expanded by an amount equivalent to ½ LSB in both upper and lower directions. The A/D conversion circuit 1 uses the expanded voltage range as a full range for the next A/D conversion. Thus, even if a conversion error equal to or smaller than ½LSB exists in the A/D conversion circuit 1, it is possible to obtain a finalized A/D conversion output of 6 bits without worsening the derivative non-linearity in the connection code portion of the conversion result in each step.

Second Embodiment

A recycling A/D converter in accordance with a second embodiment of the present invention will be explained with reference to FIGS. 5 and 6. The components identical with those of the first embodiment are denoted by the same reference numerals.

Figure 5:
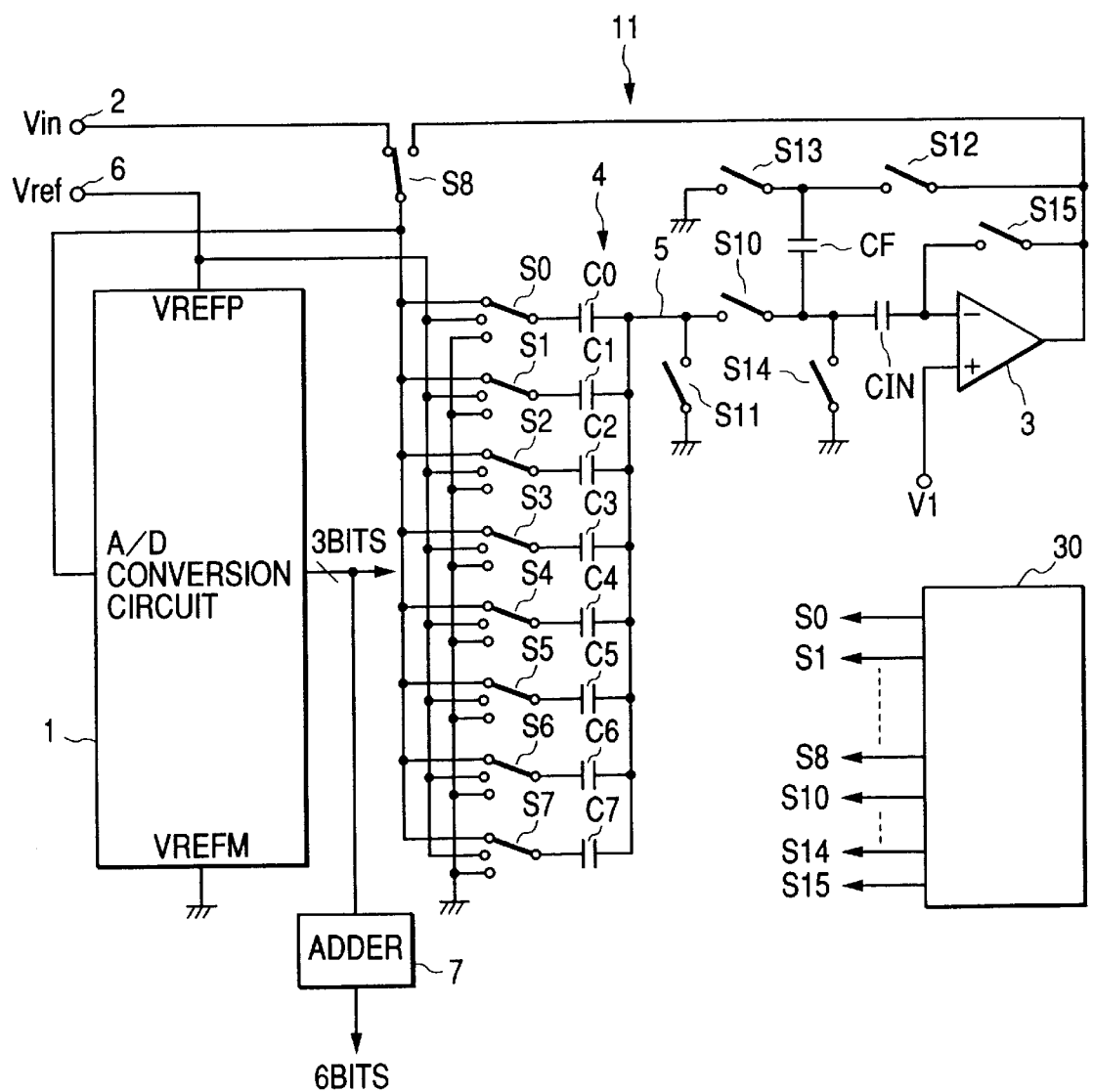
FIG. 5 is a circuit diagram showing the arrangement of a recycling A/D converter in accordance with a second embodiment of the present invention.

FIG. 5 shows a circuit arrangement for a recycling A/D converter 11. According to the circuit arrangement of FIG. 5, a capacitor CIN is connected between the inverting input terminal of the operational amplifier 3 and the switch S10. The capacitor CIN serves as an offset compensating capacitor of the present invention. The capacitor CF and a switch S12 are serially connected. The capacitor CF has one terminal connected to the switch S10 and the other terminal connected to one terminal the switch S12. The other terminal of the switch S12 is connected to the output terminal of the operational amplifier 3. The switch S12 serves as a first integration initializing switch circuit of the present invention. A switch S14, serving as a third integration initializing switch circuit, is provided. The switch S14 has one end connected to the ground terminal GND and the other end connected to the common connecting point of the switch S10 and the capacitor CF. A switch S13, serving as a second integration initializing switch circuit, is provided. The switch S13 has one end connected to the ground terminal GND and the other end connected to the common connecting point of the capacitor CF and the switch S12.

Furthermore, a switch S15, serving as an offset compensating voltage charging circuit and a compensating charge switch circuit, is provided. The switch S15 has one end connected to the inverting input terminal of the operational amplifier 3 and the other end connected to the output terminal of the operational amplifier 3. The non-inverting input terminal of the operational amplifier 3 is connected to a bias voltage V1 (e.g., 2.5V). The switches S12, S13 and S14 cooperatively constitute an integration initializing circuit of the present invention.

Next, the A/D conversion processing of the recycling A/D converter 11 will be explained with reference to a time diagram shown in FIG. 6, in which a 6-bit A/D conversion output is obtained by repeating the 3-bit A/D conversion three times (i.e., three steps). At an initial condition before starting the A/D conversion processing, the switches S11, S13, S14 and S15 are opened and the switches S10 and S12 are closed. The adder 7 is cleared to 0.

(1) Time duration from t0 to t1 (i.e., First step)

At the time t0, the switch S8 is shifted to the signal input terminal 2. The A/D conversion circuit 1 implements a first (i.e., $1^{st}$ step) A/D conversion. The A/D conversion code n1 of 3 bits produced in this first A/D conversion is added in the adder 7.

On the other hand, at the time t0, the control circuit 30 turns on the switches S11, S13, and S15 and turns off the switch S12, so that the arrayed capacitors C0 to C7 are charged to a voltage level of the input signal Vin. Namely, the charge setting for the arrayed capacitors C0 to C7 is implemented based on the input signal Vin. In this case, as the both ends of capacitor CF are connected the ground terminal GND, the electric charge of the capacitor CF is initialized to 0. Furthermore, as the operational amplifier 3 acts as a backup amplifier, a voltage applied to an op-amp. side terminal of the capacitor CIN becomes a sum of the bias voltage V1 and an offset voltage VOFF of the operational amplifier 3. A common-line side terminal of the capacitor CIN receives 0V via the switches S10 and S11. The voltage, i.e., V1+VOFF, applied between the both ends of the capacitor CIN corresponds to the offset compensating voltage.

(2) Time duration from t1 to t2 (i.e., Second step)

The control circuit 30 turns off the switches S11, S13 and S15. Then, after the switches S11, S13 and S15 are completely opened, the control circuit 30 turns on the switch S12 and shifts respective switches S0 to S7 from the sampling side to the reference voltage side or to the ground side. In this case, the switch S8 is connected to the output terminal side of the operational amplifier 3. As the electric charge of the capacitor CIN remains unchanged, the operational amplifier 3 performs a feedback control via the capacitor CIN to reduce the voltage level of the common line 5 to 0V. As a result, the offset voltage of the operational amplifier 3 is canceled by the offset compensating voltage stored in the capacitor CIN. Thus, the voltage level of the common line 5 is accurately maintained at 0V.

The charge redistribution between the arrayed capacitors C0 to C7 and the capacitor CF is implemented according to the above-described equation (1) in the same manner as that in the first embodiment. After the charge redistribution is accomplished, the A/D conversion circuit 1 executes a second 3-bit A/D conversion to obtain an A/D conversion code n2. The obtained A/D conversion code n2 is added in the adder 7.

(3) Time duration from t2 to t3 (i.e., Third step)

The control circuit 30 turns off the switch S10 at the time t2 to hold the output voltage VRES(1) of the operational amplifier 3. Subsequently, the control circuit 30 turns on the switch S11 and connects respective switches S0 to S7 to the sampling side, so that the arrayed capacitors C0 to C7 is charged to a voltage level of the output voltage VRES(1). In other words, the charge setting of the arrayed capacitors C0 to C7 is implemented based on the output voltage VRES(1) of the operational capacitor 3.

(4) Time duration from t3 to t4 (i.e., Third step)

The control circuit 30 turns off the switch S11 first and then turns on the switches S13, S14 and S15 and turns off the switch S12. At this moment, as the common line 5 is in the opened condition, the electric charge of the capacitor CF is initialized to 0 without causing any change in the electric charges of the arrayed capacitors C0 to C7. Furthermore, the capacitor CIN is charged to a voltage level of the offset compensating voltage (V1+VOFF). The control circuit 30 shifts respective switches S0 to S7 from the sampling side to the reference voltage side or the ground side during this duration or at the beginning of the next duration.

(5) Time duration from t4 to t5 (i.e., Third step)

The control circuit 30 turns off the switches S13, S14 and S15. After the switches S13, S14 and S15 are completely opened, the control circuit 30 turns on the switches S10 and S12. As a result, the charge redistribution between the arrayed capacitors C0 to C7 and the capacitor CF is implemented according to the above-described equations (3) to (5) in the same manner as that in the first embodiment. After the charge redistribution is accomplished, the A/D conversion circuit 1 executes a third 3-bit A/D conversion to obtain an A/D conversion code n3. The obtained A/D conversion code n3 is added in the adder 7. The adding method of the A/D conversion codes n1, n2 and n3 is described in the first embodiment.

As described above, according to the second embodiment, the capacitor CIN is added to the circuit arrangement of the first embodiment. The capacitor CIN acts as a capacitor for compensating the offset voltage of the operational amplifier 3. Furthermore, the second embodiment modifies the arrangement of the integration initializing circuit for initializing the capacitor CF, so that the capacitor CIN can be charged to the voltage level of the offset compensating voltage (V1+VOFF) during the initialization of the capacitor CF. Accordingly, in addition to the effects of the first embodiment, the second embodiment makes it possible to cancel the offset voltage of the operational amplifier 3 by the offset compensating voltage when the charge redistribution is implemented according to the A/D conversion code of the A/D conversion circuit 1. In other words, it becomes possible to improve the accuracy of the A/D conversion.

Moreover, providing the capacitor CIN makes it possible to set the voltage level of the non-inverting input terminal of the operational amplifier 3 to an arbitrary bias voltage V1. Hence, to realize a high-speed operation of the operational amplifier 3 with a high open-loop gain, it is preferable to set the bias voltage V1 to a voltage (e.g., 2.5V) near the mid value of the power voltage range. As a result, the settling time of the operational amplifier 3 can be shortened. An overall time required for implementing the A/D conversion can be reduced. An error of the output voltage (i.e., residue voltage) of the operational amplifier 3 can be suppressed.

Third Embodiment

A recycling A/D converter 12 in accordance with a third embodiment of the present invention will be explained with reference to FIGS. 7 and 8. The recycling A/D converter 12 is a modification of the recycling A/D converter 11 of the above-described second embodiment.

Figure 7:
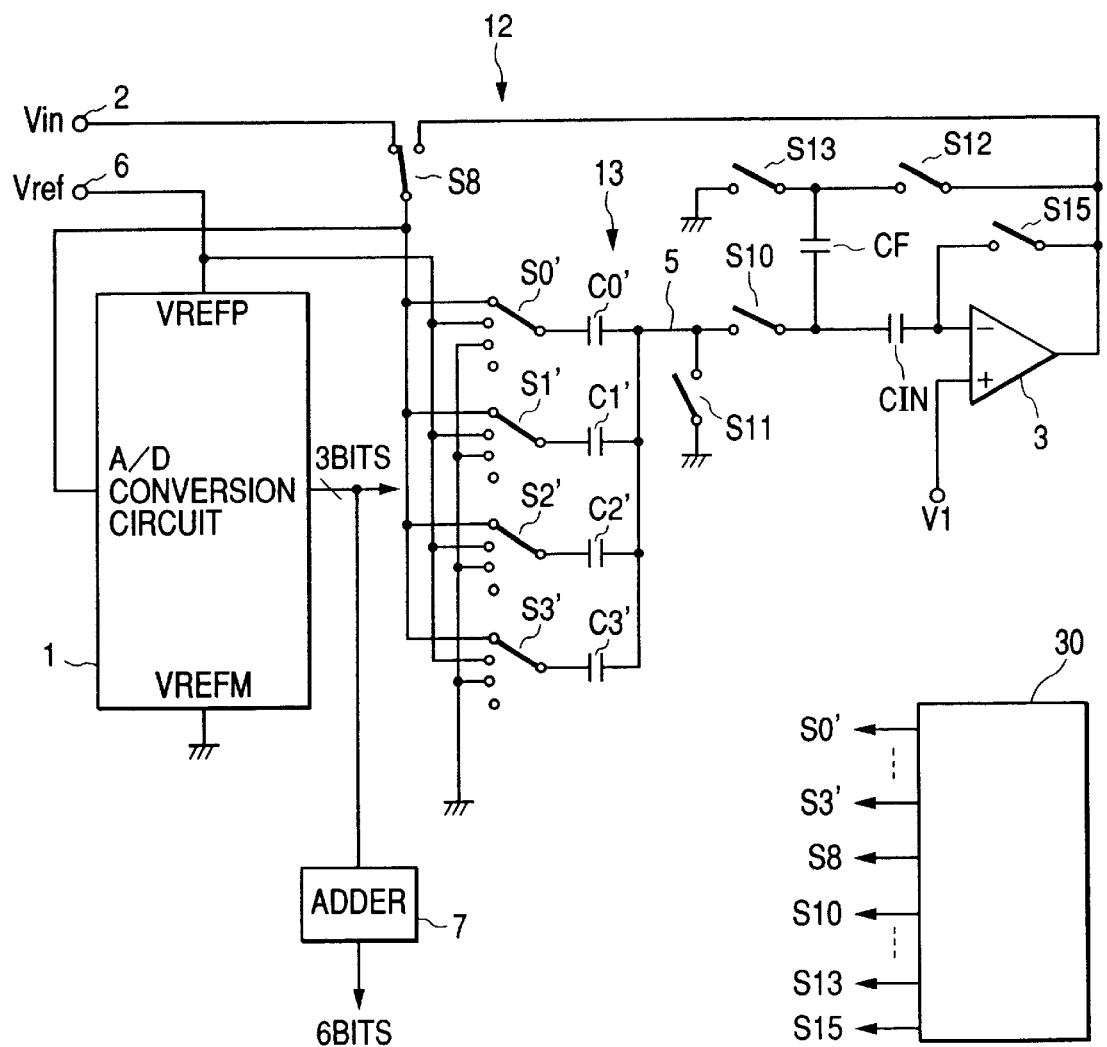
FIG. 7 is a circuit diagram showing the arrangement of a recycling A/D converter in accordance with a third embodiment of the present invention.

FIG. 7 shows a circuit arrangement of the recycling A/D converter 12 which is fabricated by using the CMOS processing. The recycling A/D converter 12 does not include the switch S14 of the recycling A/D converter 11. A capacitor array circuit 13 includes four arrayed capacitors C0', C1', C2' and C3'. The arrayed capacitors C0', C1', C2' and C3' have capacitance values of C, C, 2C, and 4C, respectively. In other words, the capacitance values of the arrayed capacitors C0', C1', C2' and C3' are weighted in terms of $2^n$ (2 to the $n^{th}$ power), where n is an integer. The top electrodes of the arrayed capacitors C0' to C3' are selectively connectable to the input terminal of the A/D conversion circuit 1, the reference voltage terminal 6, the ground terminal GND, or an opened terminal, via associated switches S0' to S3'.

Figure 8:
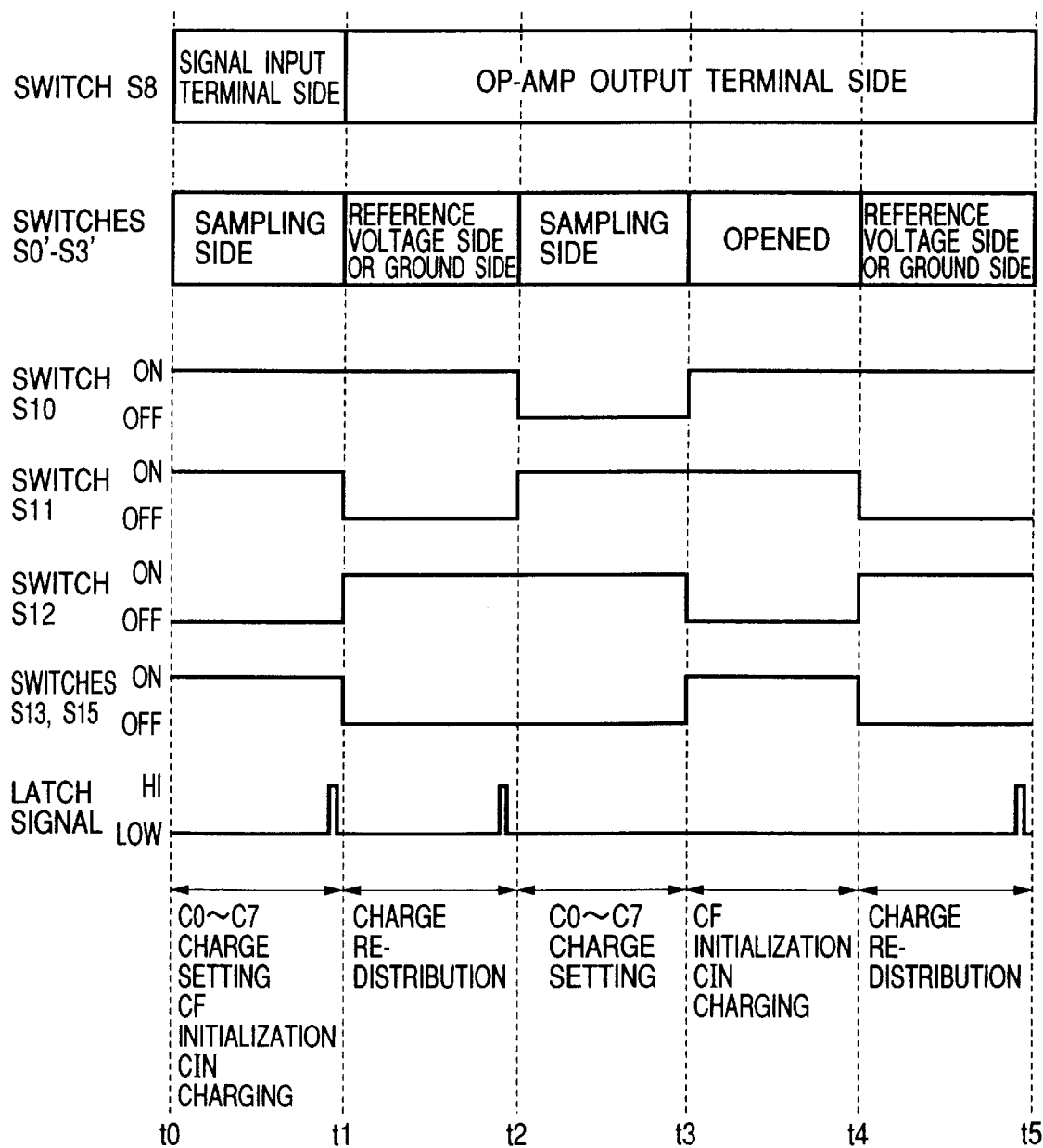
FIG. 8 is a time diagram showing operation timings of various switches in accordance with the third embodiment of the present invention.

FIG. 8 shows A/D conversion processing for obtaining a 6-bit A/D conversion output through the 3-step recycling operations. The switching operations shown in FIG. 8 are identical with those shown in FIG. 6 except for the duration from time t3 to time t4.

The duration from time t3 to time t4 is for initializing the integrating capacitor CF and for charging the capacitor CIN to the offset compensating voltage (V1+VOFF). The recycling A/D converter 12 has no switch (corresponding to S14 shown in FIG. 5) for directly connecting the common connecting point of the capacitors CF and CIN to the ground terminal GND. Thus, the control circuit 30 turns on the switches S10 and S11 to connect the common connecting point of the capacitors CF and CIN to the ground terminal GND. The control circuit 30 turns off the switches S0' to S3' prior to the above closing of the switches S10 and S11.

The recycling A/D converter 12 implements initialization of the integrating capacitor CF as well as charging of the capacitor CIN without discharging the electric charges stored in the arrayed capacitors C0' to C3' as the non-common side electrodes of the arrayed capacitors C0' to C3' are opened although the common-side electrodes of the arrayed capacitors C0' to C3' are connected to the ground terminal GND.

Furthermore, providing the capacitor array circuit 13 in which the four arrayed capacitors C0' to C3' have weighted capacitances makes it possible to reduce the total number of switches from 8 to 4. In other words, it becomes possible to compactly arrange the circuit layout.

Fourth Embodiment

Figure 9:
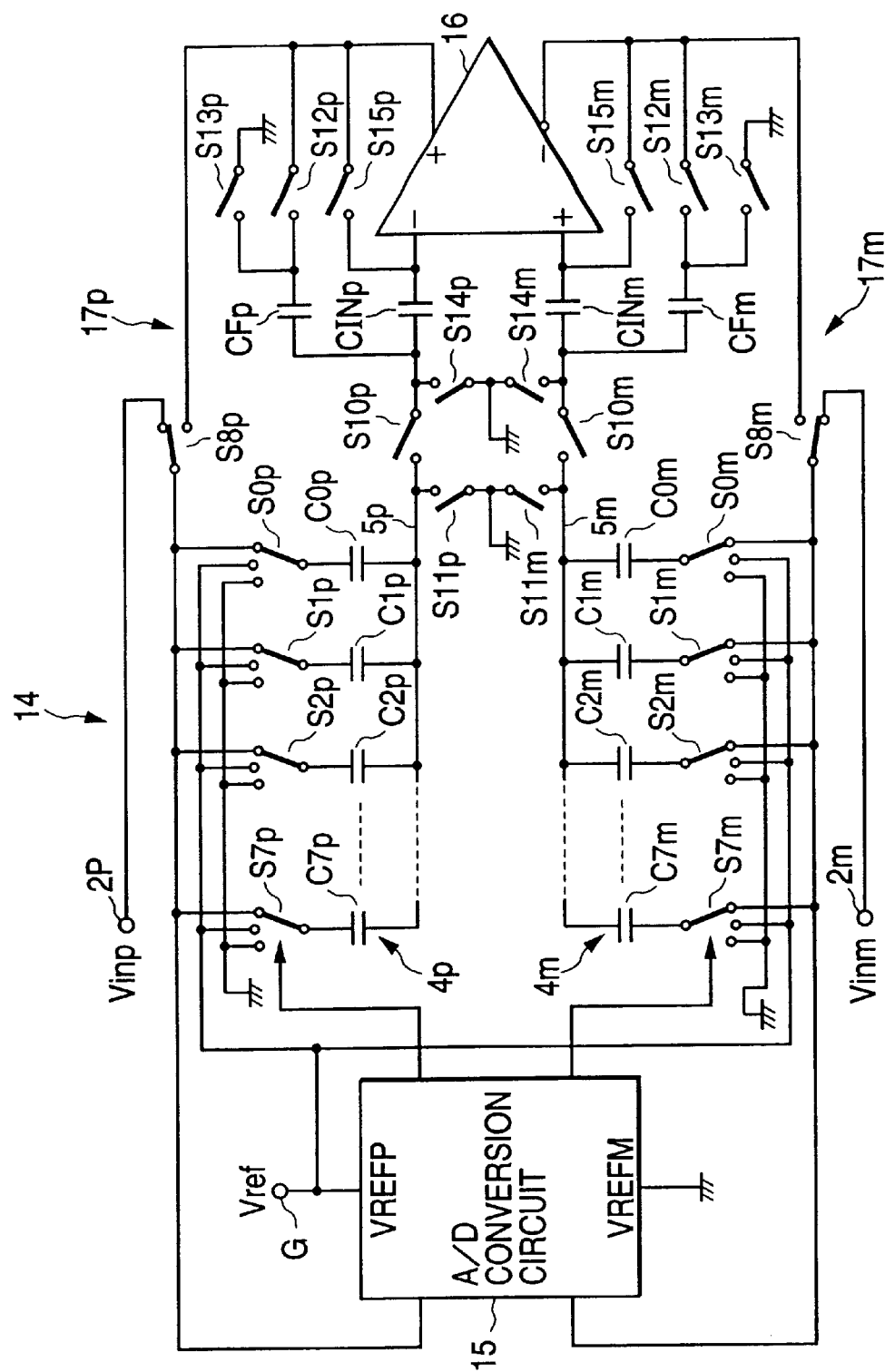
FIG. 9 is a circuit diagram showing the arrangement of a recycling A/D converter in accordance with a fourth embodiment of the present invention.

FIG. 9 shows a circuit arrangement of a recycling A/D converter 14 in accordance with a fourth embodiment of the present invention. The recycling A/D converter 14 is differentially operable. The recycling A/D converter 14 includes a parallel-type A/D conversion circuit 15 having a resolution of 3 bits which is differentially operable. The A/D conversion circuit 15 has a non-inverting input terminal selectively connectable to a non-inverting signal input terminal 2*p* or a non-inverting output terminal of an operational amplifier 16 via a switch S8*p*. Similarly, the A/D conversion circuit 15 has an inverting input terminal selectively connectable to an inverting signal input terminal 2*m* or an inverting output terminal of the operational amplifier 16 via a switch S8*m*.

A processing circuit 17*p*, serving as a non-inverting input side conversion result processing circuit of the present invention, is interposed between the non-inverting signal input terminal 2*p* (or the non-inverting output terminal of the operational amplifier 16) and an inverting input terminal of the operational amplifier 16. The processing circuit 17*p* comprises a capacitor array circuit 4*p*, consisting of arrayed capacitors C0*p* to C7*p*. The bottom electrodes of the arrayed capacitors C0*p* to C7*p* are connected to the inverting input terminal of the operational amplifier 16. Respective top electrodes of the arrayed capacitors C0*p* to C7*p* are selectively connectable to the non-inverting signal input terminal 2*p* or the non-inverting output terminal of the operational amplifier 16 via switches S0*p* to S7*p* and the switch S8*p*. The processing circuit 17*p* further comprises capacitors CFp and CINp.

Similarly, a processing circuit 17*m*, serving as an inverting input side conversion result processing circuit of the present invention, is interposed between the inverting signal input terminal 2*m* (or the inverting output terminal of the operational amplifier 16) and a non-inverting input terminal of the operational amplifier 16. The processing circuit 17*m* comprises a capacitor array circuit 4*m*, consisting of arrayed capacitors C0*m* to C7*m*. The bottom electrodes of the arrayed capacitors C0*m* to C7*m* are connected to the non-inverting input terminal of the operational amplifier 16. Respective top electrodes of the arrayed capacitors C0*m* to C7*m* are selectively connectable to the inverting signal input terminal 2*m* or the inverting output terminal of the operational amplifier 16 via switches S0*m* to S7*m* and the switch S8*m*. The processing circuit 17*m* further comprises capacitors CFm and CINm.

Each of processing circuits 17*p* and 17*m* has a circuit arrangement similar to that of FIG. 5. It is desirable that the circuit arrangement of processing circuits 17*p* and 17*m* are symmetrical. The A/D conversion circuit 15 produces, from its inverting output terminal, an A/D conversion code (8−n), where n (decimal notation) represents an A/D conversion code produced from its non-inverting output terminal. The produced A/D conversion code "n" is added in the adder (not shown) according to the method described in the first embodiment.

The differential input-output type operational amplifier 16 produces, from its non-inverting and inverting output terminals, voltages whose levels are offset by ± a predetermined amount from the zero-level voltage (e.g., 2.5V).

Figure 6:
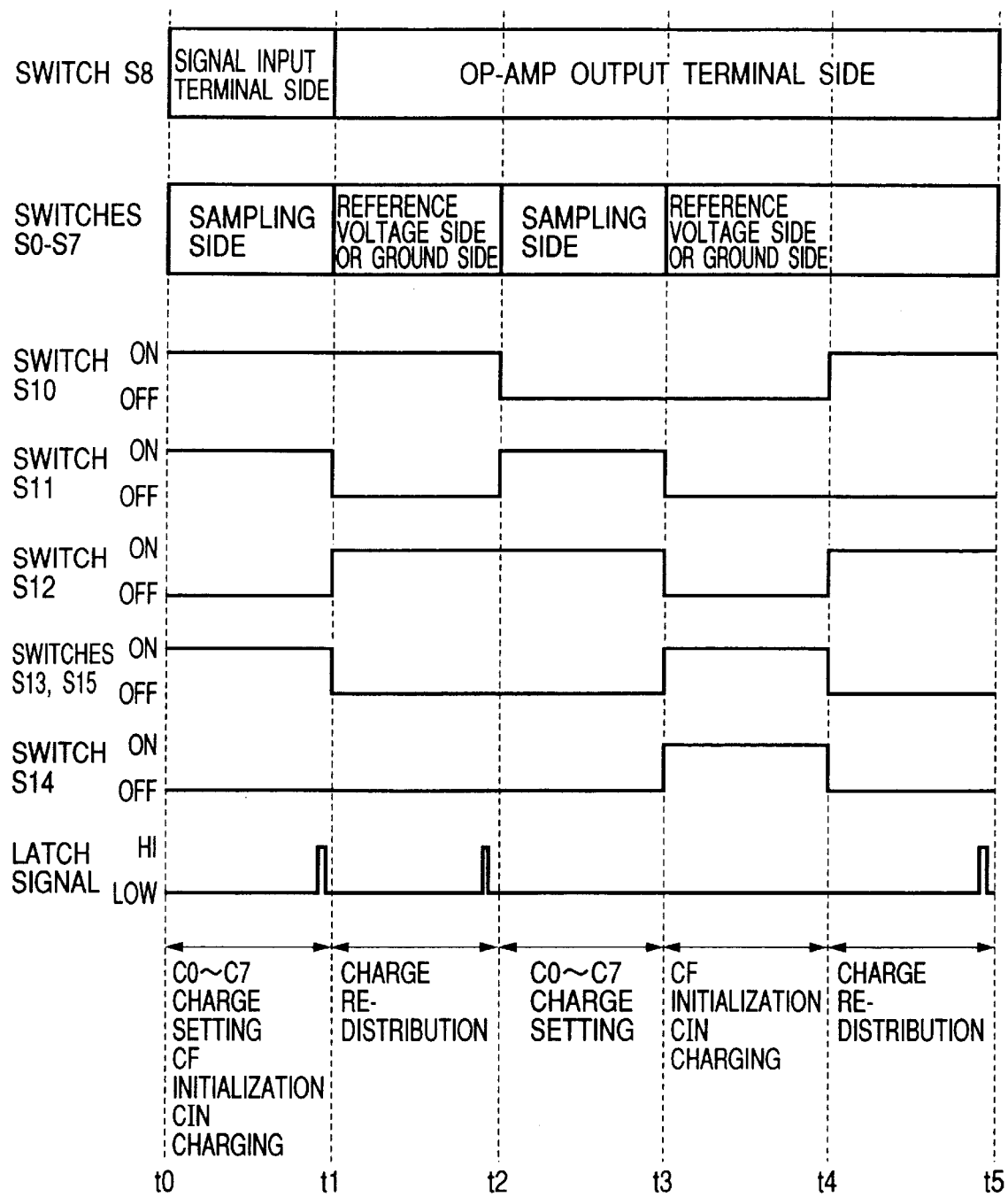
FIG. 6 is a time diagram showing operation timings of various switches in accordance with the second embodiment of the present invention.

The recycling A/D converter 14 operates in the same manner as the recycling A/D converter 11 whose operation timings are shown in FIG. 6.

However, during the charge redistribution, the switching of respective switches S0*p* to S7*p* is implemented in accordance with the A/D conversion code "n" produced from the non-inverting output terminal of the A/D conversion circuit 15. On the other hand, the switching of respective switches S0*m* to S7*m* is implemented in accordance with the A/D conversion code (8−n) produced from the inverting output terminal of the A/D conversion circuit 15.

For example, when the A/D conversion code "n" is 1, only one of the switches S0*p* to S7*p* is shifted to the reference voltage side and the remaining seven switches are shifted to the ground terminal, while seven of the switches S0*m* to S7*m* are shifted to the reference voltage side and the remaining one switch is shifted to the ground terminal. The switching operation of respective switches in the processing circuit 17*p* is performed in synchronism (at the same timings) with the switching operation of respective switches in the processing circuit 17*m*.

According to the above-described differential recycling A/D converter 14, a differential voltage between the input signal voltages Vinp and Vinm is A/D converted. Thus, in addition to the effects of the first and second embodiments, the fourth embodiment can bring the effect of removing the common mode noises coming from the outside.

Moreover, the symmetrical arrangement (or layout) and the synchronous operations of the processing circuits 17*p* and 17*m* are effective in that, even if unnecessary electric charge enters via a feedthrough, any error caused by such unnecessary electric charge can be canceled through the differential operations of the processing circuits 17*p* and 17*m*.

Fifth Embodiment

The recycling A/D converter 11 explained in the second embodiment of the present invention is preferably incorporated in a microcomputer used in an engine control unit, which is referred to as ECU (i.e., electronic control unit), of an automotive vehicle.

Figure 10:
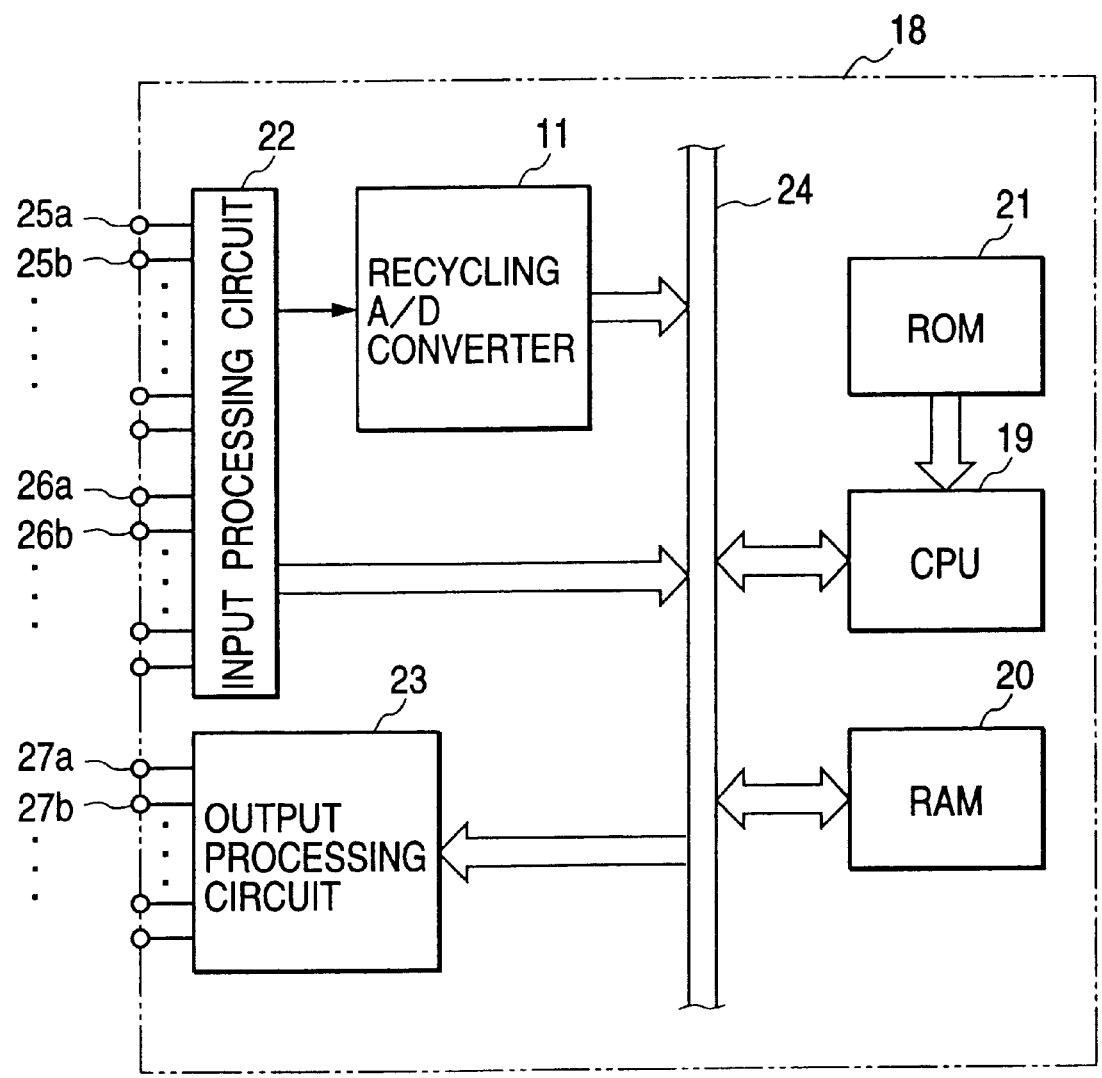
FIG. 10 is a block diagram showing an arrangement of a microcomputer in accordance with a fifth embodiment of the present invention.

FIG. 10 is a block diagram showing a schematic arrangement of a microcomputer 18 in accordance with the fifth embodiment of the present invention. The microcomputer 18, i.e., an integrated one-chip microcomputer, comprises the recycling A/D converter 11, CPU 19, RAM 20, ROM 21, an input processing circuit 22, and an output processing circuit 23 which are connected to each other via a bus 24 which includes an address bus, a data bus, and a control bus.

The microcomputer 18 operates under the power supply of a DC voltage (e.g., 5V) from an appropriate DC power source circuit (not shown), and implement various engine controls including a fuel injection, an ignition timing control, a knocking control as well as transmission controls.

CPU 19 and ROM 21 are connected via a dedicated bus for instruction fetch, so that CPU 19 can successively read instructions stored in ROM 21 via this dedicated bus. CPU 19 implements the computation processing, the judging processing, and the input/output processing necessary for the engine controls and the transmission controls according to the fetched instructions. RAM 20 acts as a storage means for storing temporary data during the above transaction.

The input processing circuit 22 comprises an analog multiplexer and a plurality of input ports. The analog multiplexer selects one analog signal from a plurality of analog signals entered via the input ports connected to analog signal input terminals 25a, 25b, - - - in accordance with an instruction of CPU 19. Then, the analog multiplexer sends the selected analog signal to the signal input terminal of the recycling A/D converter 11.

Furthermore, the input ports of the analog multiplexer receive a plurality of digital signals entered from the digital signal input terminals 26a, 26b, - - - in accordance with instructions of CPU 19.

The output processing circuit 23 has a circuit arrangement capable of functioning as output ports which generate various digital signals to the outside via associated digital signal output terminals 27a, 27b, - - - in accordance with instructions of CPU 19.

Next, advantages of employing the recycling A/D converter 11 in the microcomputer 18 will be explained.

The input processing circuit 22 receives the analog signals, e.g., a battery voltage signal, a cooling water signal, a throttle opening signal, an air-flow amount signal, a knocking signal, and solenoid current signals, which are necessary for implementing the engine controls and the transmission controls. A time interval of the A/D conversion (i.e., an A/D conversion duration) for each analog signal is determined considering the characteristics of each analog signal and a required accuracy of the converted signal. For example, the changes of the battery voltage and the cooling water temperature are very small. Thus, the required A/D conversion periods for these data are in the msec order.

However, even if the A/D conversion period for each analog signal is long, the microcomputer 18 needs to input dozens of analog signals. Thus, the recycling converter 11 is required to have a conversion time falling in a range from 1 $\mu$sec to 20 $\mu$sec. Furthermore, recent needs for advanced engine controls and transmission controls require a highly accurate control level equivalent to 12 bits in terms of resolution.

If the conventional 2-step recycling A/D converter shown in FIG. 11 is used to realize a satisfactory conversion time and a required resolution, an A/D conversion circuit 1 having a resolution of 7 bits and a capacitor array circuits 4 consisting of a total of 128 arrayed capacitors will be necessary. In this case, the A/D conversion circuit 1 of 7 bits requires 128 resistors and 127 comparators (refer to FIG. 2). In other words, the chip area occupied by the A/D converter becomes large. The cost of the microcomputer 18 (which is an integrated circuit) increases significantly.

Alternatively, if a parallel-type A/D converter is used, the number of required comparators will rise up to 4,095. Needless to say, the chip size will increase greatly. A sequential comparison type A/D converter will not be able to realize a sufficiently short conversion time equivalent to several $\mu$sec.

However, using the recycling A/D converter 11 capable of implementing 3-step recycling operations makes it possible to attain the satisfactory conversion time and the required resolution. Furthermore, the recycling A/D converter 11 requires a relatively small number of circuit components, i.e., an A/D conversion circuit 1 having a resolution of 5 bits and a capacitor array circuit 4 consisting of a total of 32 arrayed capacitors (refer to FIG. 5). The A/D converter 1 of 5 bits requires 32 resistors and 31 comparators (refer to FIG. 2). Thus, employing the 3-step recycling A/D converter 11 makes it possible to reduce the number of capacitors and related circuit elements.

Instead of using the above 3-step recycling A/D converter 11, the present invention allows to use a recycling A/D converter capable of implementing 4-step recycling operations so that the total number of circuit elements can be further reduced. Namely, the 4-step recycling A/D converter requires an A/D conversion circuit 1 having a resolution of 4 bits and a capacitor array circuit 4 consisting of a total of 16 arrayed capacitors.

In this manner, incorporating the recycling A/D converter 11 into the microcomputer 18 greatly reduces the chip area occupied by the A/D converter while attaining the satisfactory conversion time and realizing the required resolution. Thus, the cost of IC can be reduced. Furthermore, the recycling A/D converter 11 does not require a sample-and-hold circuit for holding the output level of the operational amplifier (refer to FIG. 5). This is advantageous in obtaining an accurate conversion result.

Although the fifth embodiment applies the recycling A/D converter 11 to the microcomputer 18 for the engine controls and the transmission controls, it is however possible to apply the recycling A/D converter 11 to various devices when the resolution level of the recycling A/D converter 11 and the number of required recycling steps are adequately adjusted or selected. It is needless to say that the recycling A/D converter 11 employed in the microcomputer 18 can be replaced by any one of the above-described recycling A/D converters 8, 12 and 14.

MISCELLANEOUS MODIFICATIONS

The present invention is not limited to the above-described first to fifth embodiments, and therefore can be modified or expanded in the following manner.

The A/D conversion circuits 1 and 15 are not limited to 3 bits. The number of recycling steps performed in the conversion circuits 1 and 15 may be any of 4, 5, 6, - - - . The step number 2 is acceptable in this invention. However, a desirable step number is not less than three. The type of the A/D conversion circuit 1 (and 15) is not limited to the parallel type only and therefore can be changed to other type, such as a sequential comparison type.

According to the present invention, it is possible to modify each of the recycling A/D converter 8 of the first embodiment and the recycling A/D converter 12 of the third embodiment so as to be differentially operable in the same manner as the arrangement of the recycling A/D converter 14 of the fourth embodiment.

In each of the above-described embodiments, the output voltage of the operational amplifier 3 is applied to the top electrodes of the arrayed capacitors C0 to C7 (C0' to C3') via the switches S8, and S0 to S7 (S0' to S3'). However, the present invention purports to provide the switch S10 to make the operational amplifier 3 and the capacitor CF cooperatively operate as a hold circuit. Furthermore, the present invention purports to provide the switch S11 to implement the charge setting as a preprocessing prior to the charge redistribution based on the hold voltage. Accordingly, an application of the present invention is not limited to the charge setting for the arrayed capacitors C0 to C7 (C0' to C3'). For example, the present invention can be applied to a case where there is another capacitor connected to the common line 5 and the charge setting for this capacitor is performed based on the above hold voltage.

This invention may be embodied in several forms without departing from the spirit of essential characteristics thereof. The present embodiments as described are therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. A recycling A/D converter comprising:
   an A/D conversion circuit;
   a capacitor array circuit comprising a plurality of arrayed capacitors, each arrayed capacitor having a common electrode connected to a common line and a non-common electrode selectively connectable to either a first reference voltage line and a second reference voltage line in response to a conversion result of said A/D conversion circuit;
   an operational amplifier having an input terminal connected to said common line;
   an integrating capacitor connected between said input terminal and an output terminal of said operational amplifier;
   an integration initializing circuit for initializing said integrating capacitor;
   a circuit arrangement for inputting an output voltage of said operational amplifier to said A/D conversion circuit and to said non-common electrodes of said arrayed capacitors;
   a first switching circuit provided between said common line and said input terminal of said operational amplifier; and
   a second switching circuit provided between said common line and said first reference voltage line,
   wherein, in the A/D conversion of a third or succeeding step, charge setting of said arrayed capacitors is implemented based on the output voltage of said operational amplifier by closing said second switching circuit under a condition where said first switching circuit is opened, and then said integrating capacitor is initialized by said integration initializing circuit.

2. The recycling A/D converter in accordance with claim 1, wherein
   said integration initializing circuit is constituted by an integration initializing switch circuit connected in parallel to said integrating capacitor, and
   said integrating capacitor is initialized by closing said integration initializing switch circuit under a condition where said first and second switching circuits are opened.

3. The recycling A/D converter in accordance with claim 1, wherein
   an offset compensating capacitor is interposed between the input terminal of said operational amplifier and a common connecting point of one terminal of said first switching circuit and one terminal of said integrating capacitor, and
   an offset compensating voltage charging circuit is provided for charging said offset compensating capacitor to an offset compensating voltage level.

4. The recycling A/D converter in accordance with claim 3, wherein
   said integration initializing circuit comprises:
   a first integration initializing switch circuit connected between the other terminal of said integrating capacitor and the output terminal of said operational amplifier;
   a second integration initializing switch circuit connected between the other terminal of said integrating capacitor and said first reference voltage line; and
   a third integration initializing switch circuit connected between said one terminal of said integrating capacitor and said first reference voltage line, and
   said offset compensating voltage charging circuit comprises a compensating charge switch circuit connected between the input and output terminals of said operational amplifier.

5. The recycling A/D converter in accordance with claim 4, wherein initialization of said integrating capacitor and charging of said offset compensating capacitor are implemented by closing said compensating charge switch circuit and said second and third integration initializing switch circuits while opening said first integration initializing switch circuit under a condition where said first and second switching circuits are opened.

6. The recycling A/D converter in accordance with claim 3, wherein
   said integration initializing circuit comprises a first integration initializing switch circuit connected between the other terminal of said integrating capacitor and the output terminal of said operational amplifier, and a second integration initializing switch circuit connected between the other terminal of said integrating capacitor and said first reference voltage line,
   said offset compensating voltage charging circuit comprises a compensating charge switch circuit connected between the input and output terminals of said operational amplifier, and
   said non-common electrodes of said arrayed capacitors are arranged to be openable.

7. The recycling A/D converter in accordance with claim 6, wherein initialization of said integrating capacitor and charging of said offset compensating capacitor are implemented by closing said first and second switching circuits, said compensating charge switch circuit and said second integration initializing switch circuit while opening said first integration initializing switch circuit under a condition where said non-common electrodes of said arrayed capacitors are opened.

8. The recycling A/D converter in accordance with claim 3, wherein said operational amplifier is biased by a predetermined voltage which is within a power voltage supplied to said operational amplifier.

9. The recycling A/D converter in accordance with claim 1, wherein
said A/D conversion circuit is arranged to be differentially operable,
said capacitor array circuit, said integrating capacitor, and said integration initializing circuit cooperatively constitute a non-inverting input side conversion result processing circuit which is connected to an inverting input terminal of said operational amplifier,
an inverting input side conversion result processing circuit, identical in arrangement with said non-inverting input side conversion result processing circuit, is connected to a non-inverting input terminal of said operational amplifier, and
said non-inverting input side conversion result processing circuit and said inverting input side conversion result processing circuit are differentially operable.

10. The recycling A/D converter in accordance with claim 3, wherein
said A/D conversion circuit is arranged to be differentially operable,
said capacitor array circuit, said integrating capacitor, said integration initializing circuit, said offset compensating capacitor, and said offset compensating voltage charging circuit cooperatively constitute a non-inverting input side conversion result processing circuit which is connected to an inverting input terminal of said operational amplifier,
an inverting input side conversion result processing circuit, identical in arrangement with said non-inverting input side conversion result processing circuit, is connected to a non-inverting input terminal of said operational amplifier, and
said non-inverting input side conversion result processing circuit and said inverting input side conversion result processing circuit are differentially operable.

11. The recycling A/D converter in accordance with claim 1, wherein
said arrayed capacitors are identical with each other in their capacitance values.

12. The recycling A/D converter in accordance with claim 1, wherein
capacitance values of said arrayed capacitors are weighted in terms of $2^n$, where n is an integer.

13. The recycling A/D converter in accordance with claim 1, wherein
said A/D conversion circuit has a resolution of "m" bits,
the capacitance of said integrating capacitor is set to $\frac{1}{2}^{(m-1)}$ equivalent to a sum of capacitances of said arrayed capacitors, and
a total of n steps of A/D conversion values produced from said A/D conversion circuit are successively added by overlapping one bit and cutting a least significant bit, thereby generating an A/D conversion output having a resolution of n×(m−1) bits.

14. The recycling A/D converter in accordance with claim 1 wherein said A/D conversion circuit is a parallel type.

* * * * *

UNITED STATES PATENT AND TRADEMARK OFFICE
CERTIFICATE OF CORRECTION

PATENT NO.     : 6,320,530 B1
DATED          : November 20, 2001
INVENTOR(S)    : Masakiyo Horie It is certified that error appears in the above-identified patent and that said Letters Patent is hereby corrected as shown below:

<u>Title page,</u>
Item [30], Foreign Application Priority Data, change "12-539313" to be
-- "2000-53913" --

Signed and Sealed this

Ninth Day of September, 2003

JAMES E. ROGAN
*Director of the United States Patent and Trademark Office*